(12) United States Patent
Herner

(10) Patent No.: US 8,450,209 B2
(45) Date of Patent: *May 28, 2013

(54) P+ POLYSILICON MATERIAL ON ALUMINUM FOR NON-VOLATILE MEMORY DEVICE AND METHOD

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/314,513

(22) Filed: Dec. 8, 2011

(65) Prior Publication Data

US 2012/0142163 A1 Jun. 7, 2012

Related U.S. Application Data

(63) Continuation of application No. 12/940,920, filed on Nov. 5, 2010, now Pat. No. 8,088,688.

(51) Int. Cl.
*H01L 21/44* (2006.01)
*H01L 29/02* (2006.01)
*H01L 29/40* (2006.01)

(52) U.S. Cl.
USPC ............... 438/658; 438/660; 438/688; 257/2; 257/771

(58) Field of Classification Search
None
See application file for complete search history.

(56) References Cited

U.S. PATENT DOCUMENTS

| | | | |
|---|---|---|---|
| 680,652 A | 8/1901 | Elden | |
| 4,433,468 A | 2/1984 | Kawamata | |
| 4,684,972 A | 8/1987 | Owen et al. | |
| 4,741,601 A | 5/1988 | Saito | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,538,564 A | 7/1996 | Kaschmitter | |
| 5,541,869 A | 7/1996 | Rose et al. | |
| 5,594,363 A | 1/1997 | Freeman et al. | |

(Continued)

FOREIGN PATENT DOCUMENTS

KR 1020110014248 A 2/2011
WO WO 2009/005699 A1 1/2009

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

(Continued)

*Primary Examiner* — Scott B Geyer
(74) *Attorney, Agent, or Firm* — Ogawa P.C.

(57) ABSTRACT

A method of forming a non-volatile memory device includes providing a substrate having a surface and forming a first dielectric overlying the surface, forming a first wiring comprising aluminum material over the first dielectric, forming a silicon material over the aluminum material to form an intermix region consuming a portion of the silicon material and aluminum material, annealing to formation a first alloy from the intermix region, forming a p+ impurity polycrystalline silicon over the first alloy material, forming a first wiring structure from at least a portion of the first wiring, forming a resistive switching element comprising an amorphous silicon material formed over the p+ polycrystalline silicon, and forming a second wiring structure comprising at least a metal material over the resistive switching element.

20 Claims, 8 Drawing Sheets

U.S. PATENT DOCUMENTS

| | | | |
|---|---|---|---|
| 5,614,756 A | 3/1997 | Forouhi et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,128,214 A | 10/2000 | Kuekes et al. |
| 6,143,642 A | 11/2000 | Sur, Jr. et al. |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,365,411 B2 | 4/2008 | Campbell |
| 7,405,418 B2 | 7/2008 | Happ et al. |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,550,380 B2 | 6/2009 | Elkins et al. |
| 7,606,059 B2 | 10/2009 | Toda |
| 7,615,439 B1 | 11/2009 | Schricker et al. |
| 7,728,318 B2 | 6/2010 | Raghuram et al. |
| 7,729,158 B2 | 6/2010 | Toda et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 * | 1/2012 | Herner .................. 438/658 |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,394,670 B2 | 3/2013 | Herner |
| 2004/0026682 A1 | 2/2004 | Jiang |
| 2004/0194340 A1 | 10/2004 | Kobayashi |
| 2005/0020510 A1 | 1/2005 | Benedict |
| 2005/0029587 A1 | 2/2005 | Harshfield |
| 2007/0008773 A1 | 1/2007 | Scheuerlein |
| 2007/0015348 A1 | 1/2007 | Hsu et al. |
| 2007/0087508 A1 | 4/2007 | Herner |
| 2007/0105284 A1 | 5/2007 | Herner |
| 2007/0105390 A1 | 5/2007 | Oh |
| 2007/0205510 A1 | 9/2007 | Lavoie et al. |
| 2007/0290186 A1 | 12/2007 | Bourim et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0206931 A1 | 8/2008 | Breuil et al. |
| 2009/0001345 A1 | 1/2009 | Schricker et al. |
| 2009/0014707 A1 | 1/2009 | Lu et al. |
| 2009/0052226 A1 | 2/2009 | Lee et al. |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0298224 A1 | 12/2009 | Lowrey |
| 2009/0321789 A1 | 12/2009 | Wang et al. |
| 2010/0012914 A1 | 1/2010 | Xu et al. |
| 2010/0019310 A1 | 1/2010 | Sakamoto |
| 2010/0032638 A1 | 2/2010 | Xu |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157710 A1 | 6/2010 | Lambertson et al. |
| 2010/0176368 A1 | 7/2010 | Ko et al. |
| 2010/0219510 A1 | 9/2010 | Scheuerlein et al. |
| 2010/0321095 A1 | 12/2010 | Mikawa et al. |
| 2011/0133149 A1 | 6/2011 | Sonehara |
| 2011/0155991 A1 | 6/2011 | Chen |
| 2011/0198557 A1 | 8/2011 | Rajendran et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0317470 A1 | 12/2011 | Lu et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043654 A1 | 2/2012 | Lu et al. |
| 2012/0104351 A1 | 5/2012 | Wei et al. |
| 2012/0145984 A1 | 6/2012 | Rabkin et al. |
| 2012/0155146 A1 | 6/2012 | Ueda et al. |
| 2012/0235112 A1 | 9/2012 | Huo et al. |

OTHER PUBLICATIONS

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.

A. E. Owen et al., "Switching in amorphous devices", INT. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.

Office Action for U.S. Appl. No. 11/875,541 dated Mar. 30, 2011.

Office Action for U.S. Appl. No. 11/875,541 dated Oct. 5, 2011.

Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed Oct. 8, 2009.

Ex parte Quayle Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed Jun. 10, 2011.

Notice of Allowance for U.S. Appl. No. 13/158,231 dated Apr. 17, 2012.

Office Action for U.S. Appl. No. 12/835,704 dated Sep. 21, 2011.

Office Action for U.S. Appl. No. 12/835,704 dated Mar. 1, 2012.

Advisory Action for U.S. Appl. No. 12/835,704 dated Jun. 8, 2012.

International Search Report and Written Opinion for PCT/US2011/046035 filed on Jul. 29, 2011.

Office Action for U.S. Appl. No. 12/861,650 dated Jan. 25, 2012.

Notice of Allowance for U.S. Appl. No. 12/861,650 dated Jun. 19, 2012.

Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.

Kuk-Hwan Kim et al., "Nanoscale resistive memory with intrinsic diode characteristics and long endurance," Applied Physics Letters, 2010, pp. 053106-1-053106-3, vol. 96, American Institute of Physics.

Sung Hyun Jo et al., "Si-Based Two-Terminal Resistive Switching Nonvolatile Memory", IEEE, 2008.

Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.

Wei Lu et al., "Nanoelectronics from the bottom up", Nature Materials, www.nature.com/naturematerials, Nov. 2007, pp. 841-850, vol. 6, Nature Publishing Group.

Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.

Sung Hyun Jo et al., "Experimental, Modeling and Simulation Studies of Nanoscale Resistance Switching Devices", $9^{th}$ Conference on Nanotechnology, IEEE, 2009, pp. 493-495.

Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.

Sung Hyun Jo et al., "Si Memristive Devices Applied to Memory and Neuromorphic Circuits", Proceedings of 2010 IEEE International Symposium on Circuits and Systems, 2010, pp. 13-16.

Wei Lu et al., "Supporting Information", 2008.

Sung Hyun Jo et al., "High-Density Crossbar Arrays Based on a Si Memristive System", Nano Letters, 2009, pp. 870-874, vol. 9 No. 2, American Chemical Society Publications.

Sung Hyun Jo et al., "High-Density Crossbar Arrays Based on Si Memristive System", Supporting Information, 2009, pp. 1-4.

Sung Hyun Jo et al., "Programmable Resistance Switching in Nanoscale Two-Terminal Devices", Nano Letters, 2009, pp. 496-500, vol. 9 No. 1, American Chemical Society Publications.

Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.

S. K. Dey, "Electrothermal model of switching in amorphous silicon films", J. Vac. Sci. Technol., Jan./Feb. 1980, pp. 445-448, vol. 17, No. 1, American Vacuum Society.

J. Hajto et al., "The Programmability of Amorphous Silicon Analogue Memory Elements", Mat. Res. Soc. Symp. Proc., 1990, pp. 405-410, vol. 192, Materials Research Society.

M. J. Rose et al., "Amorphous Silicon Analogue Memory Devices", Journal of Non-Crystalline Solids, 1989, pp. 168-170, vol. 115, Elsevier Science Publishers B.V., North-Holland.

A. Moopenn et al., "Programmable Synaptic Devices for Electronics Neural Nets", Control and Computers, 1990, pp. 37-41, vol. 18 No. 2.

P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.

J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.

A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.

J. Hajto et al., "Electronic Switching in Amorphous-Semiconductor Thin Films", Materials Science Library, Sep. 30, 1992, Chapter 14, pp. 640-701, Artech House, London, UK.

J. Hajto et al., "Analogue memory and ballistic electron effects in metal-amorphous silicon structures", Philosophical Magazine B, 1991, pp. 349-369, vol. 63 No. 1, Taylor & Francis Ltd.

A. J. Holmes et al., "Design of Analogue Synapse Circuits using Non-Volatile a-Si:H Memory Devices", Proceedings ISCAS, 1994, pp. 351-354.

Yajie Dong et al., "Si/a-Si Core/Shell Nanowires as Nonvolatile Crossbar Switches", Nano Letters, Jan. 2008, pp. 386-391, vol. 8 No. 2, American Chemical Society.

European Search Report for Application No. EP 09 81 9890.6 of Mar. 27, 2012.

D. A. Muller et al., "The Electronic structure at the atomic scale of ultrathin gate oxides", Nature, Jun. 24, 1999, pp. 758-761, vol. 399.

J. Suñé et al., "Nondestructive multiple breakdown events in very thin $SiO_2$ films", Applied Physics Letters, 1989, pp. 128-130, vol. 55.

Herve Marand et al., MESc. 5025 lecture notes: Chapter 7. Diffusion, University of Vermont, http://www.files.chem.vt.edu/chem-dept/marand/MEScchap6-1c.pdf.

A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.

Sung Hyun Jo, "Nanoscale Memristive Devices for Memory and Logic Applications", Ph. D dissertation, University of Michigan, 2010.

Office Action for U.S. Appl. No. 12/894,098 dated Aug. 1, 2012.

Sung Hyun Jo et al., "CMOS Compatible Nanoscale Nonvolatile Resistance Switching Memory", Nano Letters, 2008, pp. 392-397, vol. 8, No. 2.

Office Action for U.S. Appl. No. 12/582,086 dated Apr. 19, 2011.

Office Action for U.S. Appl. No. 12/582,086 dated Sep. 6, 2011.

Notice of Allowance for U.S. Appl. No. 12/582,086 dated Oct. 21, 2011.

International Search Report for PCT/US2009/061249 filed on Oct. 20, 2009.

Written Opinion of the International Searching Authority for PCT/US2009/061249 filed on Oct. 20, 2009.

Notice of Allowance for U.S. Appl. No. 12/939,824 dated Jul. 24, 2012.

Office Action for Application No. EP 1100 5207.3 dated Aug. 8, 2012.

Office Action for U.S. Appl. No. 12/814,410 dated Apr. 17, 2012.

Office Action for U.S. Appl. No. 12/835,699 dated Aug. 24, 2011.

Notice of Allowance for U.S. Appl. No. 12/835,699 dated Feb. 6, 2012.

Office Action for U.S. Appl. No. 12/833,898 dated Apr. 5, 2012.

European Search Report for Application No. EP 1100 5207.3 of Oct. 12, 2011.

Notice of Allowance for U.S. Appl. No. 12/833,898 dated May 30, 2012.

Notice of Allowance for U.S. Appl. No. 12/939,824 dated May 11, 2012.

Office Action for U.S. Appl. No. 12/913,719 dated Feb. 17, 2011.

Office Action for U.S. Appl. No. 12/913,719 dated Jul. 22, 2011.

Notice of Allowance for U.S. Appl. No. 12/913,719 dated Mar. 12, 2012.

Notice of Allowance for U.S. Appl. No. 12/940,920 dated Oct. 5, 2011.

Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.

Office Action for U.S. Appl. No. 13/149,653 dated Apr. 25, 2012.

International Search Report for PCT/US2011/045124 filed on Jul. 22, 2011.

Written Opinion of the International Searching Authority for PCT/US2011/045124 filed on Jul. 22, 2011.

Peng-Heng Chang et al, "Aluminum spiking at contact windows in Al/Ti-W/Si", Appl. Phys. Lett., Jan. 25, 1988, pp. 272-274, vol. 52 No. 4, American Institute of Physics.

J. Del Alamo et al, "Operating limits of Al-alloyed high-low junction for BSF solar cells", Solid-State Electronics, 1981, pp. 415-420, vol. 24, Pergamon Press Ltd., Great Britain.

Hao-Chih Yuan et al, "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.

Office Action for U.S. Appl. No. 12/861,650 dated Oct. 16, 2012.

Notice of Allowance for U.S. Appl. No. 12/894,087 dated Oct. 25, 2012.

Notice of Allowance for U.S. Appl. No. 13/149,807 dated Oct. 29, 2012.

Notice of Allowance for U.S. Appl. No. 12/861,666 dated Nov. 14, 2012.

Office Action for U.S. Appl. No. 13/156,232, dated Nov. 26, 2012.

Notice of Allowance for U.S. Appl. No. 13/290,024 dated Nov. 28, 2012.

Notice of Allowance for U.S. Appl. No. 12/814,410 dated Jan. 8, 2013.

Office Action for U.S. Appl. No. 13/417,135 dated Oct. 9, 2012.

Notice of Allowance for U.S. Appl. No. 13/532,019 dated Nov. 14, 2012.

Office Action for U.S. Appl. No. 13/149,653 dated Nov. 20, 2012.

Office Action of U.S. Appl. No. 13/436,714 dated Dec. 7, 2012.

Corrected Notice of Allowance for U.S. Appl. No. 12/861,666 dated Jan. 11, 2013.

Supplemental Notice of Allowance for U.S. Appl. No. 12/894,087 dated Jan. 11, 2013.

Notice of Allowance for U.S. Appl. No. 13/314,513 dated Jan. 24, 2013.

Notice of Allowance for U.S. Appl. No. 13/118,258, dated Feb. 6, 2013.

International Search Report and Written Opinion for PCT/US2012/040242, filed May 31, 2012.

Office Action for U.S. Appl. No. 13/679,976, dated Mar. 6, 2013.

Notice of Allowance for U.S. Appl. No. 12/894,098, dated Mar. 15, 2013.

Office Action for U.S. Appl. No. 13/465,188, dated Mar. 19, 2013.

Office Action for U.S. Appl. No. 12/861,432 dated Mar. 29, 2013.

Notice of Allowance for U.S. Appl. No. 13/748,490, dated Apr. 9, 2013.

* cited by examiner

P+ POLYSILICON MATERIAL ON ALUMINUM FOR NON-VOLATILE MEMORY DEVICE AND METHOD

CROSS REFERENCE TO RELATED APPLICATIONS

This patent application is a continuation of U.S. patent application Ser. No. 12/940,920, filed on Nov. 5, 2010, which is incorporated by reference in its entirety herein for all purposes.

STATEMENT RELATED TO FEDERAL OR GOVERNMENT SPONSORED RESEARCH

Not Applicable

BACKGROUND

The present invention is directed to switching devices. More particularly, embodiments according to the present invention provide a method and a device structure for a resistive switching device. The resistive switching device can be used as a non-volatile memory device but it should be recognized that the present invention acan have a much broader range of applicability.

The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching for a PCRAM device requires large amounts of power. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is directed to switching devices. More particularly, embodiments according to the present invention provide a method and a device structure for a resistive switching device. The resistive switching device can be used as a non-volatile memory device but it should be recognized that the present invention can have a much broader range of applicability.

In a specific embodiment, a method of forming a non-volatile memory device is provided. The method includes providing a semiconductor substrate having a surface region. A first dielectric material is formed overlying the surface region. The method includes forming a first wiring material overlying the first dielectric material. In a specific embodiment, the first wiring material includes at least an aluminum material. In a specific embodiment, a silicon material is formed overlying the first electrode material. The method includes forming an intermix region by consuming a portion of the silicon material and a portion of the aluminum material using at least an anneal process. In a specific embodiment, the annealing process causes formation of a first alloy material from the intermix region and a polycrystalline silicon material having a p+ impurity characteristic overlying the first alloy material. In a specific embodiment, the polycrystalline silicon material having the p+ impurity is derived from an aluminum species from the aluminum material and the silicon material. A resistive switching material comprising an amorphous silicon material is formed overlying the polycrystalline silicon material having the p+ impurity characteristic. The method forms second wiring material comprising at least a metal material overlying the resistive switching material in a specific embodiment.

In a specific embodiment, a non-volatile memory device is provided. The device includes a semiconductor substrate having a surface region and a first dielectric material overlying the surface region. The device includes a first wiring structure comprising at least an aluminum material overlying the first dielectric material. In a specific embodiment, a first alloy material formed from a silicon material and the aluminum material overlies the aluminum material, and a polycrystalline silicon material having a p+ impurity characteristic overlies the first alloy material. In a specific embodiment, the polycrystalline silicon material having the p+ impurity is derived from the silicon material and an aluminum species from the aluminum material. The device includes a resistive switching element comprising an amorphous silicon material overlying the polycrystalline silicon material having the p+ impurity characteristic, and a second wiring structure comprising at least a metal material overlying the resistive switching element.

Many benefits can be achieved by ways of the present invention over conventional techniques. For example, the present method forms a p+ polysilicon material by depositing a silicon material overlying aluminum and allows the aluminum material to diffuse into the silicon material to form the p+ polysilicon material in a specific embodiment. The present method eliminates at least an otherwise costly implantation process to form the p+ polysilicon material. Additionally, the present method further eliminates aluminum spiking in the polysilicon material as a result of annealing process to crystallize the silicon material at a high temperature of greater than about 600 Degree Celsius. More importantly, the present method can be achieved without modification to existing process equipment and techniques. Depending on the embodiment, one or more of these benefits may be achieved. One skilled in the art would recognize other variations, modifications, and alternatives.

DETAILED DESCRIPTION OF THE PRESENT INVENTION

Figure 1:
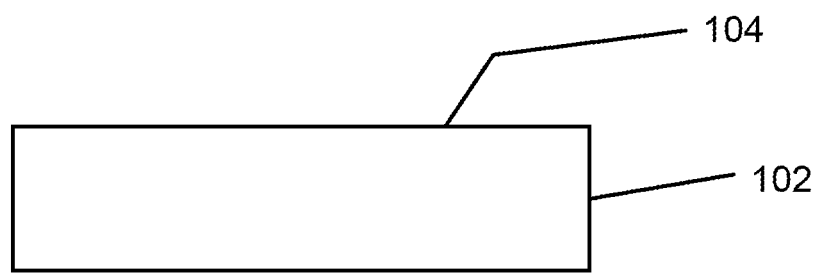
FIGS. 1-5 are simplified diagrams illustrating part of the steps of a conventional method of forming a non volatile memory device.
Figure 2:
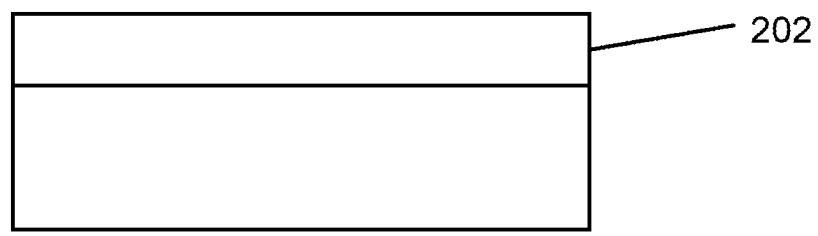
Figure 3:
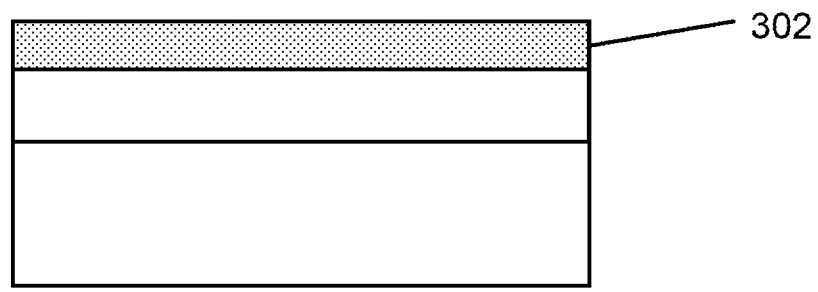
Figure 4:
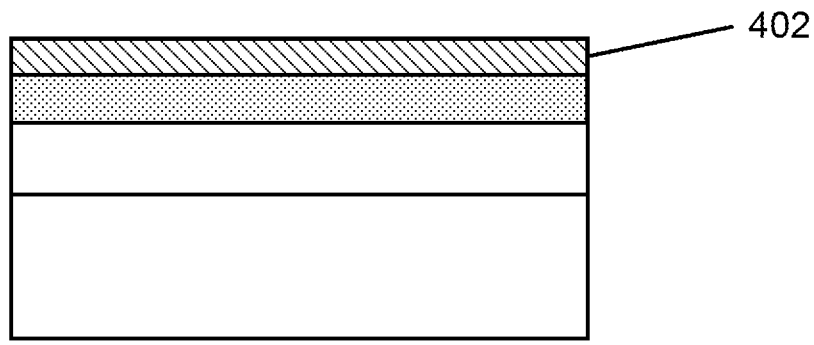
Figure 5:
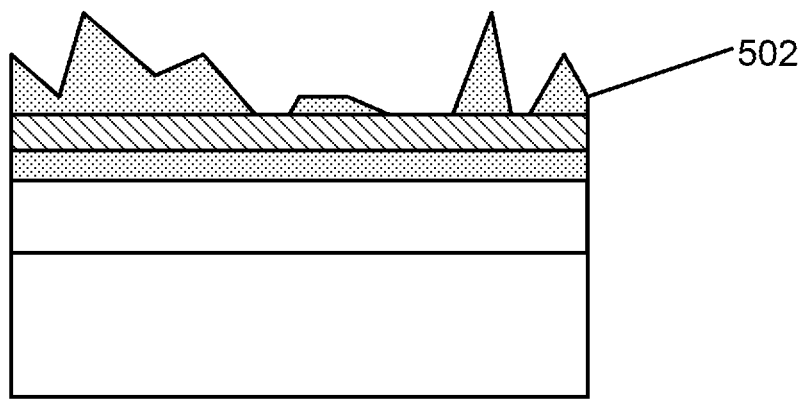

The present invention is directed to switching devices. More particularly, embodiments according to the present invention provide a method and a device structure for a resistive switching device. The resistive switching device can be used as a non-volatile memory device but it should be recognized that the present invention can have a much broader range of applicability FIGS. 1-5 illustrate part of the steps of a conventional method for forming a non volatile memory device. As shown, the conventional method includes provided a semiconductor substrate 102 having a surface region 104. The semiconductor substrate can be single crystal silicon, silicon on insulator, silicon germanium or other suitable material. A first dielectric material 202 is formed overlying a surface region of the semiconductor substrate. The first dielectric material can be silicon oxide or silicon nitride or a low K dielectric, or a high K dielectric or a dielectric stack depending on the application. The conventional includes depositing a first wiring material 302 overlying the first dielectric material. The first wiring material can be common metal materials used in CMOS processing. For example the first wiring material can be copper, aluminum or tungsten. In certain conventional method, the first wiring material is subjected to a pattern and etch process to form a first wiring structure. The conventional method then forms a p+ polysilicon material 402 overlying at least the first wiring structure. The p+ polysilicon material may be formed by co-depositing a silicon material with a suitable dopant using a chemical vapor deposition process. The chemical vapor deposition process can be low pressure chemical vapor deposition. Deposition temperature is usually greater than about 450 Degree Celsius to form crystalline silicon. For the first wiring electrode using aluminum material, temperature higher than about 450 Degree Celsius causes aluminum to spike through 502 the silicon material and forms undesirable conductive paths in the amorphous silicon layer. Other methods to obtain doped polycrystalline silicon material at temperatures less than 450C. include plasma enhanced chemical vapor deposition process of Si and/or the addition of germanium to the Si mixture. However these techniques usually require modifications to conventional tools and additional experimentation. Silicon germanium compositions with high germanium concentrations can be difficult to integrate into a stack structure, as they etch easily and are subject to undercut during etching.

Figure 6:
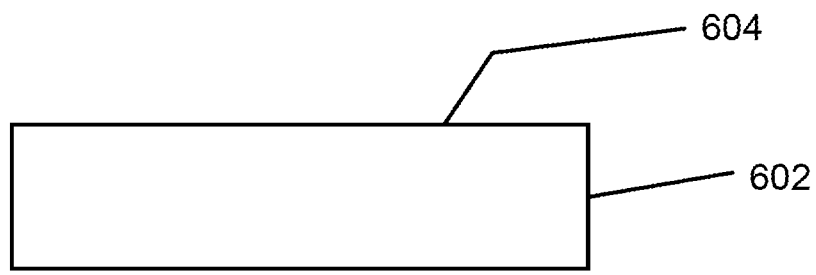
FIGS. 6-17 are simplified diagrams illustrating a method of forming a non volatile memory device according to an embodiment of the present invention.
Figure 7:
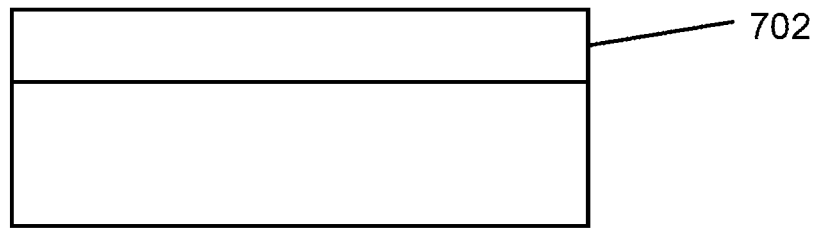
Figure 8:
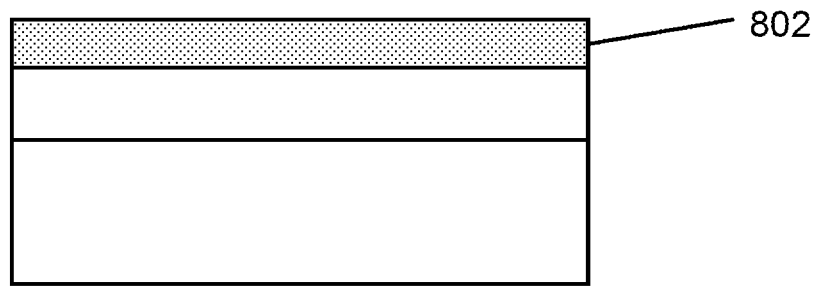

Embodiments according to the present invention provide a method to form p+ polysilicon material for fabrication of a non-volatile memory device. As shown in FIG. 6, a semiconductor substrate 602 having a surface region 604 is provided. The semiconductor substrate can be single crystal silicon, silicon on insulator, or silicon germanium depending on the application. The semiconductor substrate can have one or more transistor device formed thereon. The one or more transistor device provides control circuitry for the non-volatile memory device in a specific embodiment. A first dielectric material 702 is formed overlying the surface region of the semiconductor substrate. The first dielectric material can be silicon oxide, silicon nitride, a dielectric stack of alternating layers of silicon oxide and silicon nitride, a high K dielectric material, or a low K dielectric material depending on the embodiment.

The method includes forming a first wiring material 802 overlying the first dielectric material. The first wiring material is aluminum. The first wiring material can include one or more adhesive layer or diffusion barrier layer to promote adhesion between the metal material and the first dielectric material. In a specific embodiment, the first wiring material uses aluminum. Aluminum may be deposited using a physical vapor process. In other embodiments, aluminum may be deposited by a chemical vapor deposition process using precursors such as trimethyl aluminum (TMA) or dimethyl aluminum hydride (DMAH) usually in a hydrogen atmosphere. Other suitable precursors may also be used depending on the application. Deposition temperature can range from about 150 Degree Celsius to about 300 Degree Celsius depending on the precursors and deposition pressure used.

Figure 9:
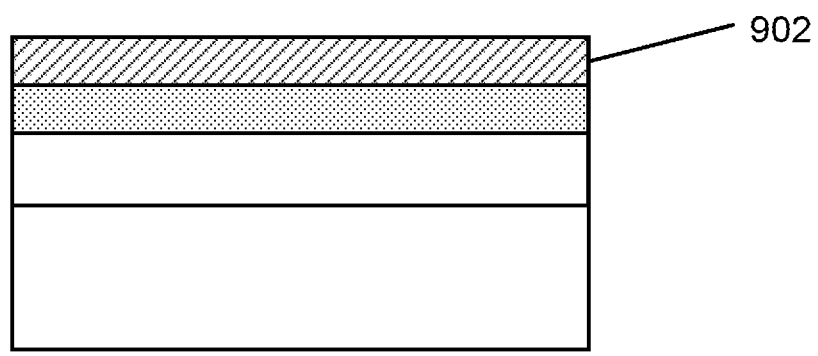

In a specific embodiment, the method includes depositing a silicon material 902 overlying aluminum as shown in FIG. 9. The silicon material can be formed using a chemical vapor process using silane as precursor. Deposition temperature can range from about 250 Degree Celsius to about 750 Degree Celsius. Depending on the temperature for deposition, the silicon material can be an amorphous silicon material, or a polysilicon material. Typically, a deposition temperature ranging from about 200 Degree Celsius to about 350 Degree Celsius would from an amorphous silicon material. Deposition temperature in the range of 350 Degree Celsius to about 750 Degree Celsius would result in a polycrystalline silicon material. Depending on the application, the silicon material can have a thickness ranging from about 0.1 um to about 1 um and less.

Figure 10:
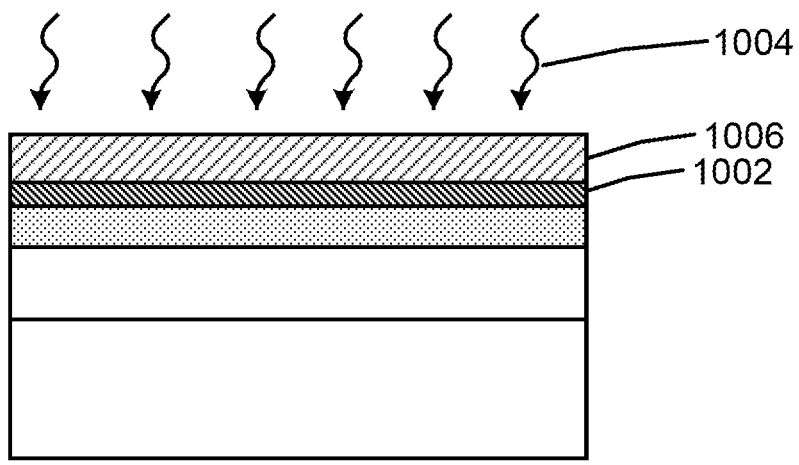

Referring to FIG. 10, the method forms an intermix region 1002 using an annealing process 1004 as shown in FIG. 10. In a specific embodiment, the annealing process is performed at a temperature ranging from about 600 Degree Celsius to about 900 Degree Celsius. The annealing process effectively melts the aluminum material allowing a certain amount of silicon material to dissolve in the melted aluminum material in the annealing process. The intermix region comprises the aluminum material and the silicon material in a specific embodiment. After cooling, an alloy material of silicon and aluminum material is formed in the intermix region from the silicon material and the aluminum material. The alloy material has a eutectic composition, which has about 11.3 percent of the silicon material and about 88.7 percent of the aluminum material by weight. Additionally, during cooling, a silicon material 1006 grows by way of liquid phase epitaxy overlies the alloy material. The silicon material is doped with aluminum and forms a polycrystalline silicon material having a p+ type impurity characteristic or a p+ polycrystalline silicon material after cooling. In a specific embodiment, the p+ type polycrystalline silicon material can have an aluminum concentration of about 10e18 atoms per $cm^3$ to about 10e20 atoms per $cm^3$ depending on the annealing time and annealing temperature, among others.

Figure 11:
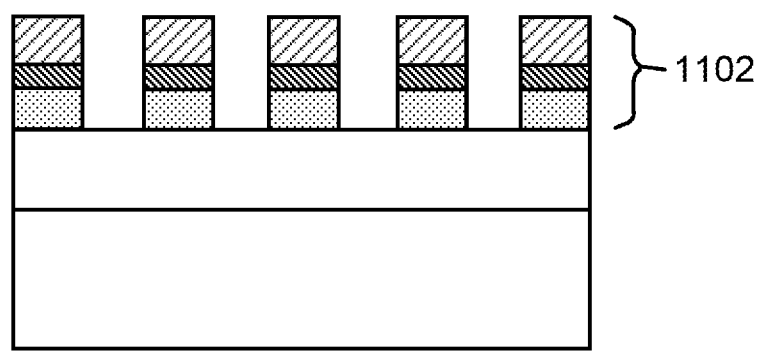

Referring to FIG. 11, the method subjects the aluminum material, the alloy material, and the polysilicon material to a first pattern and etch process to form a plurality of first structures 1102 overlying the first dielectric material. In a specific embodiment, each of the first structures including the aluminum material, the alloy material, and the polysilicon material, is elongated in shape and spatially disposed to orient in a first direction. Each of the first structures includes a first wiring structure comprising at least the aluminum material spatially extending in the first direction in a specific embodiment.

Figure 12:
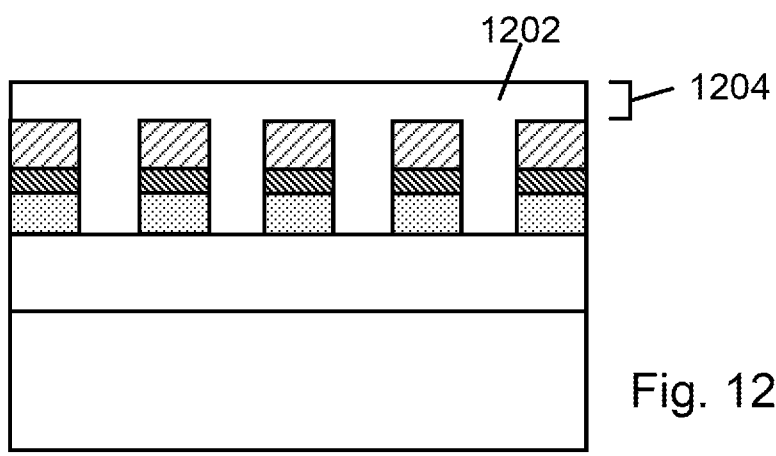

Referring to FIG. 12, the method includes depositing a second dielectric material 1202 overlying each of the plurality of the first structures to fill a plurality of gap regions formed from the first pattern and etch process. As shown in FIG. 12, the second dielectric material forms a thickness 1204 overlying each of the first structure in a specific embodiment.

Figure 13:
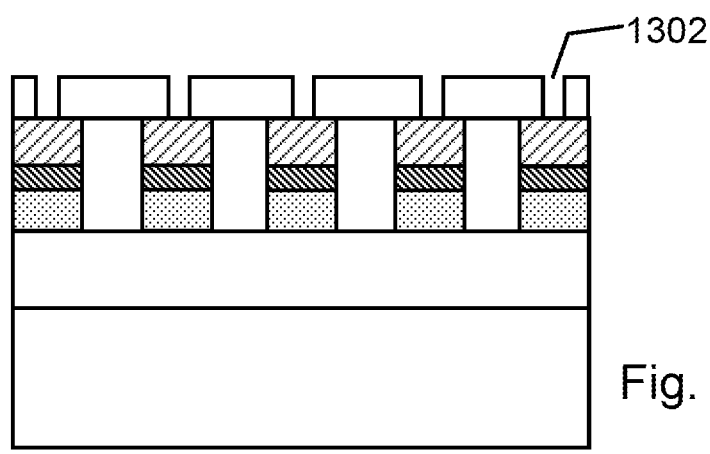
Figure 14:
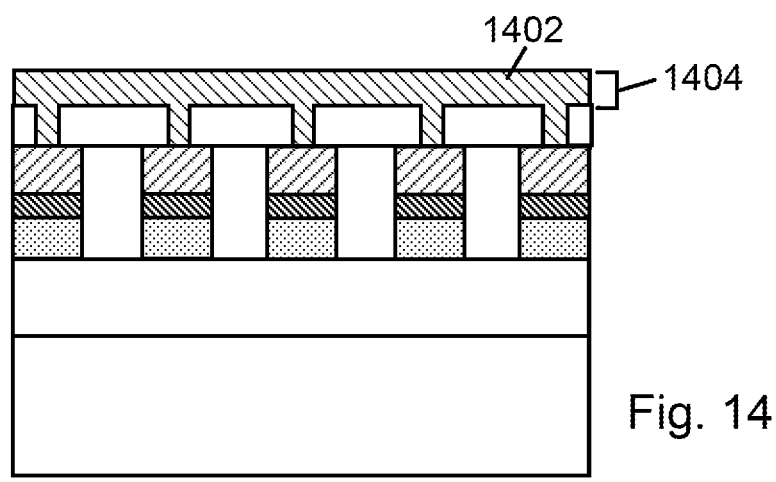

Referring to FIG. 13, the method subjects the second dielectric material to a second pattern and etch process to form a via opening to expose a portion of a surface region of the p+ polysilicon material of each of the fist structure in a specific embodiment. In a specific embodiment, the method deposits a resistive switching material 1402 to fill the via opening and forms a thickness 1404 overlying the second dielectric material as shown in FIG. 14. In a specific embodiment, the resistive switching material is an amorphous silicon material. The amorphous silicon material is not deliberately doped in a specific embodiment. Depending on the application, the amorphous silicon material may be deposited using a chemical vapor deposition process using silane or a chlorosilane (for example, trichlorosilane or dichlorosilane in the presence of a hydrogen species) as a precursor. Alternatively, the amorphous silicon material may be deposited using a sputtering process from a silicon target.

Figure 15:
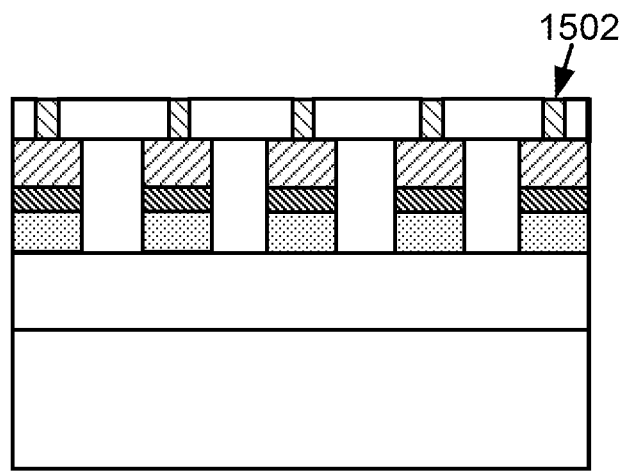

In a specific embodiment, the method subjects the amorphous silicon material to an etch back process to remove the amorphous silicon material from the surface of the second dielectric material and to isolate the amorphous silicon material in the via opening as shown in FIG. 15. As shown, the amorphous silicon material in the via opening forms a switching element 1502 for a resistive switching device in a specific embodiment.

Figure 16:
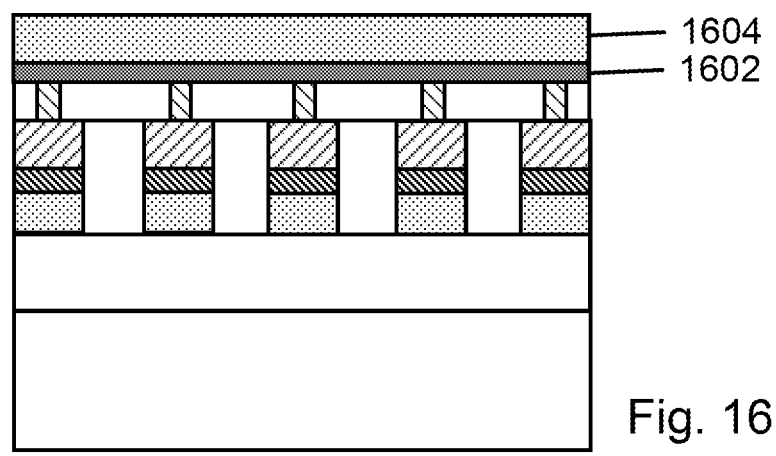

Referring to FIG. 16, in a specific embodiment, the method deposits a metal material 1602 overlying the switching element and the exposed surface region of the second dielectric material. The metal material is configured to have a physical and electrical contact with the switching element in a specific embodiment. For amorphous silicon material as the resistive switching material, the metal material can be silver, gold, platinum, palladium, nickel, or aluminum, and other suitable metal materials. The metal material may be deposited using techniques such as sputtering, chemical vapor deposition, electrochemical deposition, including electroplating, electrodeless plating and a combination depending on the application. The metal material is preferably having a desirable diffusion characteristic in a presence of an electric field provided by an operating voltage in a specific embodiment. The method further deposits a second wiring material 1604 overlying the metal material. The second wiring material can be a suitable conductor material such as tungsten, aluminum, or copper depending on the application. The second wiring material may be deposited using techniques such as sputtering, chemical vapor deposition, electrochemical deposition, including electroplating, electrodeless plating and a combination depending on the application. The second wiring material can also a diffusion barrier material overlying the metal to prevent the metal material to migrate to other parts of the device to cause shorts and other failure. The diffusion barrier material can be titanium, titanium nitride, tungsten nitride, and the likes depending on the embodiment.

In a specific embodiment, the method includes subjecting the metal material and the second wiring material to a third pattern and etch process to form a second wiring structure. The second wiring structure is configured to have an elongated shape spatially extending in a second direction. The second direction is orthogonal to the first direction to provide for an interconnected crossbar array in a specific embodiment. In a specific embodiment, each of the switching elements is disposed in an intersection region formed from the first wiring structure and the second wiring structure. The method further forms a third dielectric material overlying the second wiring structure and to fill the void regions formed by the pattern and etch process to isolate the second wiring structure in a specific embodiment.

Depending on the application, there can be other variations. For example, the resistive switching device can comprise a pillar structure including the metal material, the amorphous silicon material, and the p+ polysilicon material. The pillar structure is sandwiched between the intersection region formed from the first wiring structure and the second wiring structure. In another embodiment, the metal material can be formed in a second via opening in a dielectric material rather than being formed concurrent with the second wiring structure. Of course one skill in the art would recognize other variations, modifications, and alternatives.

Figure 17:
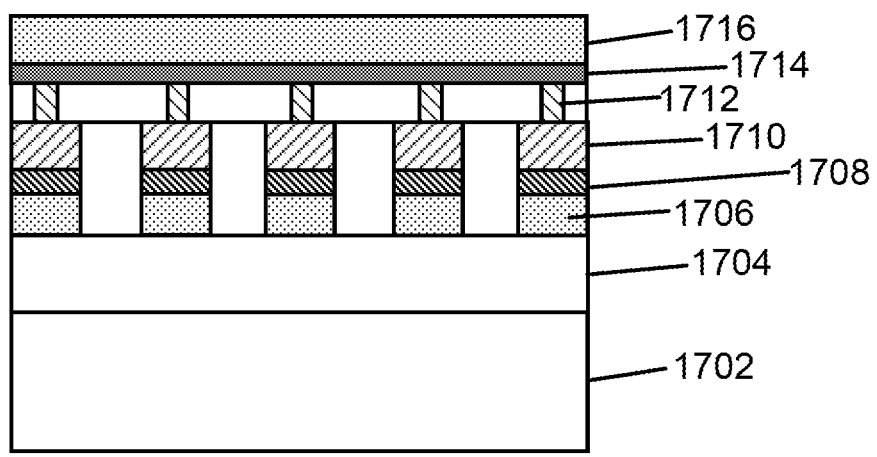

In a specific embodiment, a non-volatile memory device structure is provided as shown in a simplified diagram in FIG. 17. The device includes a semiconductor substrate 1702 having a surface region. The semiconductor substrate can be a single crystal silicon material, a silicon germanium material, a silicon on insulator (commonly called SOI) substrate, or other suitable material depending on the application. A first dielectric material 1704 overlies the surface region of the semiconductor substrate. The first dielectric material can be silicon oxide, silicon nitride, a multilayer dielectric stack such an ONO (silicon oxide on silicon nitride on silicon oxide) stack, a low K dielectric material, a high K dielectric material, and others. In a specific embodiment, the device includes a first wiring structure 1706 overlying the first dielectric material. The first wiring structure includes at least an aluminum material and spatially arranged to extend in a first direction in a specific embodiment. The device includes an alloy material 1708 overlying the first wiring structure and a polycrystalline silicon material 1710 overlying the alloy material in a specific embodiment. The alloy material is formed from a silicon material deposited overlying the aluminum material and the aluminum material in an annealing process in a specific embodiment. The polycrystalline silicon material is characterized by a p+ impurity characteristic derived from an aluminum species from the aluminum material and the silicon material in a specific embodiment.

Referring still to FIG. 17, the device includes a resistive switching material 1712 overlying the polycrystalline silicon material having the p+ impurity characteristic. The resistive switching material includes an amorphous silicon material in a specific embodiment. A metal material 1714 overlies the resistive switching material. For an amorphous silicon material as the resistive switching material, the metal can be silver, gold, platinum, palladium, nickel, aluminum and others. The metal material is has a suitable diffusion characteristic in the amorphous silicon material under an electric field in a specific embodiment. The device includes a second wiring structure 1716 configured to extend in a second direction orthogonal to the first direction in a specific embodiment. As illustrated in FIG. 17, the metal material forms part of the second wring structure in a specific embodiment. In other embodiment, the metal material can be formed in a via structure, in direct contact with the resistive switching material and the second wiring structure. Of course one skilled in the art would recognize other variations, modifications, and alternatives.

In a specific embodiment, the metal material forms a metal region in a portion of the switching material when a first voltage greater than about a threshold voltage is applied to the first wiring structure or the second wiring structure. The metal region causes a change in resistance of the switching material. As merely an example, for amorphous silicon as the switching material and silver as the metal material, a positive bias greater than a threshold voltage applied to the second wiring structure causes a silver region to form in a portion of the amorphous silicon material and causes a change in resistance of the amorphous silicon material. The switching device is now in a low resistance state or an off state. In a specific embodiment, the silver region further includes a filament structure that extends or retracts depending on an operating voltage. That is when a positive bias greater than a first voltage is applied to the second wiring structure of an off state device, the filament extends and the device in is at an on state.

A negative bias applied to the second wiring structure of an on state device causes the device to be at the off state again. Of course one skilled in the art would recognize other modifications, variations, and alternatives.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a non-volatile memory device, comprising:
   forming a first dielectric layer over a surface region of a semiconductor substrate;
   forming a first wiring layer comprising an aluminum material over the first dielectric layer;
   forming a silicon layer over the first wiring layer;
   performing an anneal process to form an intermix region from a portion of the silicon layer and a portion of the aluminum material, wherein the intermix region comprises: a polycrystalline silicon layer having a p+ impurity characteristic, wherein a p+ impurity for the polycrystalline silicon layer is derived from an aluminum species from the aluminum layer;
   forming a resistive switching layer comprising an amorphous silicon material over the polycrystalline silicon layer having the p+ impurity characteristic; and
   forming a second wiring layer comprising a metal material over the resistive switching layer.

2. The method of claim 1 wherein the first intermix region also comprises a first alloy material having a eutectic composition of silicon in aluminum.

3. The method of claim 1 wherein a temperature for performing the anneal process ranges from about 600 Degree Celsius to about 900 Degree Celsius.

4. The method of claim 1 wherein the first wiring layer further comprises an adhesion material or a diffusion barrier material interposed between the first dielectric material and the aluminum material.

5. The method of claim 1 wherein the metal material is selected from a group consisting of: silver, gold, palladium, nickel, platinum, or aluminum or a combination thereof.

6. The method of claim 5 wherein the second wiring layer further comprises tungsten.

7. The method of claim 1 wherein the polycrystalline silicon material having a p+ impurity characteristic is configured to be a contact material to control an interfacial characteristic between the amorphous silicon material and the first wiring layer.

8. The method of claim 1 wherein the amorphous silicon material is not deliberately doped.

9. The method of claim 1 wherein forming the resistive switching layer comprises forming a plurality of pillars from the resistive switching layer.

10. The method of claim 9 wherein forming the resistive switching layer further comprises:
    forming a second dielectric layer over the resistive switching layer;
    forming a plurality of vias within the second dielectric layer to expose a top surface of the resistive switching layer;
    depositing the amorphous silicon material over the second dielectric layer and within the plurality of vias to contact the top surface of the resistive switching layer; and
    removing amorphous silicon above the second dielectric layer, but not within the plurality of vias to form the plurality of pillars.

11. A non-volatile memory device, comprising:
    a first dielectric material layer overlying a surface region of a semiconductor substrate having a surface region;
    a first wiring material layer comprising an aluminum material overlying the first dielectric material layer;
    a first alloy material layer formed from a silicon material and the aluminum material, wherein the first alloy material is formed over the aluminum material;
    a polycrystalline silicon material layer having a p+ impurity characteristic overlying the first alloy material layer, wherein a p-type impurity for the polycrystalline silicon material layer is derived from aluminum species from the aluminum material;
    a resistive switching element comprising an amorphous silicon material overlying the polycrystalline silicon material layer; and
    a second wiring material layer comprising at least a metal material overlying the resistive switching element.

12. The device of claim 11 wherein the first alloy material layer comprises a eutectic composition of the silicon material and the aluminum material.

13. The device of claim 11 wherein the polycrystalline silicon material layer is formed by an anneal process having a temperature within the range of about 600 Degree Celsius to about 900 Degree Celsius.

14. The device of claim 11 wherein the first wiring layer further comprises an adhesion material or a diffusion barrier material interposed between the first dielectric material layer and the aluminum material.

15. The device of claim 11 wherein the metal material is selected from a group consisting of: silver, gold, palladium, nickel, platinum, or aluminum or a combination thereof.

16. The device of claim 11 wherein the metal material comprises tungsten on top of silver.

17. The device of claim 11 wherein the polycrystalline silicon material layer is configured to be a contact material to control an interfacial characteristic between the amorphous silicon material and the first wiring material layer.

18. The device of claim 11 wherein the amorphous silicon material is not deliberately doped.

19. A non-volatile memory device, comprising:
    a first dielectric material layer overlying a surface region of a semiconductor substrate having a surface region;
    a first wiring material layer comprising an aluminum material overlying the first dielectric material layer;
    a first alloy material layer formed from a silicon material and the aluminum material, wherein the first alloy material is formed over the aluminum material;
    a polycrystalline silicon material layer having a p+ impurity characteristic overlying the first alloy material layer, wherein a p-type impurity for the polycrystalline silicon material layer is derived from aluminum species from the aluminum material;
    a resistive switching element comprising an amorphous silicon material overlying the polycrystalline silicon material layer; and
    a second wiring material layer comprising at least a metal material overlying the resistive switching element;
    wherein the resistive switching element comprises a plurality of pillars of amorphous silicon material.

20. The method of claim 19
    wherein the resistive switching element further comprises a second dielectric layer over the resistive switching element;

wherein the resistive switching element includes a plurality of vias exposing a top surface of the resistive switching element; and wherein the plurality of pillars of the amorphous silicon material are formed with the plurality of vias.

* * * * *